United States Patent [19]
Hara et al.

[11] Patent Number: 4,727,246
[45] Date of Patent: Feb. 23, 1988

[54] IC CARD

[75] Inventors: Kazuya Hara; Kenji Rikuna; Harumi Nakano, all of Tokyo, Japan

[73] Assignee: Casio Computer Co., Ltd., Tokyo, Japan

[21] Appl. No.: 766,759

[22] Filed: Aug. 16, 1985

[30] Foreign Application Priority Data

Aug. 31, 1984 [JP] Japan .................. 59-132596[U]
Nov. 30, 1984 [JP] Japan .................. 59-253555
Nov. 30, 1984 [JP] Japan .................. 59-253556

[51] Int. Cl.$^4$ ............................ G06K 19/02
[52] U.S. Cl. .................... 235/488; 29/831; 174/52 FP; 235/441; 235/492; 361/401; 361/398
[58] Field of Search ............... 235/487, 492, 488, 441; 174/52 FP; 357/74; 361/398, 401; 29/831, 841

[56] References Cited

U.S. PATENT DOCUMENTS

| | | | |
|---|---|---|---|
| 4,065,197 | 12/1977 | Kuist et al. | 339/DIG. 3 |
| 4,216,577 | 8/1980 | Badet et al. | 29/831 |
| 4,288,841 | 9/1981 | Gogal | 357/74 X |
| 4,437,718 | 3/1984 | Selinko | 339/DIG. 3 |
| 4,447,716 | 5/1984 | Aigo | 235/492 |
| 4,649,418 | 3/1987 | Uden | 357/74 X |

Primary Examiner—David L. Trafton
Attorney, Agent, or Firm—Frishauf, Holtz, Goodman & Woodward

[57] ABSTRACT

An IC card comprises a core member having an integrated circuit pellet storing portion made of an insulating material and defined by an opening of a predetermined shape, a plurality of conductive metal foils each having one end at which integrated circuit pellet connecting portions are formed and another end at which flexible connecting terminal portions are formed, an insulating base for bearing at least the connecting terminal portions of the plurality of conductive metal foils, and an integrated circuit pellet having a memory portion and a plurality of electrode terminals which read out, to the exterior of the pellet, memory content prestored in the memory portion and stored in the integrated circuit pellet storing portion of the core member, the plurality of electrode terminals being bonded on the flexible integrated circuit pellet connecting portions of the plurality of conductive metal foils.

11 Claims, 17 Drawing Figures

IC CARD

BACKGROUND OF THE INVENTION

This invention relates to an IC card and, more particularly, to an improvement in an IC card suitable for use as a credit card, an identification card or the like.

Recently, an IC card having an inbuilt integrated circuit pellet, such as an IC, LSI or the like, has been developed as a credit card, an identification card and the like. In an IC card of this type, the buried structure of an integrated circuit pellet and its method of construction is as follows. Electrode terminals of the pellet are first connected, by wire bonding, to an insulating base material providing stiff lead wires corresponding to the electrode terminals of the pellet, and a synthetic resin for forming an integrated circuit chip is molded around the pellet. The molded chip is stored in a storing portion of an inner core, and the lead wires are connected to connecting terminals formed on the insulating board. Thereafter, an overcoat is formed on the resultant structure.

However, since the integrated circuit chip is molded in the conventional IC card having the above structure, the lead wires are of a stiff material and are connected between the chip and the board. Thus, the lead wires lack the flexibility to deal with external pressure, resulting in poor mechanical strength and reliability of the IC card. For this reason, if the card is subjected to external pressure or shock, those connecting portions between the lead wires, the chip and/or the board, can be easily damaged.

The conventional IC card has a structure that requires complex manufacturing steps, resulting in high cost. Three bonding processes for electrically connecting the integrated circuit pellet are required, the number of manufacturing steps increasing to include an inner lead bonding, an outer lead bonding and lead connecting.

SUMMARY OF THE INVENTION

It is, therefore, an object of the present invention to provide a new and improved IC card of high reliability, despite its being subjected to shocks and bending forces; a card, moreover, that can be manufactured at a low cost and a through a minimum of manufacturing steps.

According to the present invention, an IC card comprises a core member having an integrated circuit pellet storing portion made of an insulating material and defined by an opening of a predetermined shape; a plurality of conductive metal foils each having one end at which flexible integrated circuit pellet connecting portions are formed and another end at which connecting terminal portions are formed; an insulating base for bearing at least the connecting terminal portions of the plurality conductive metal foils; and an integrated circuit pellet having a memory portion and a plurality of electrode terminals which read out to the exterior of the pellet, memory content pre-stored in the memory portion and stored in the integrated circuit pellet storing portion of the core member, the plurality of electrode terminals being bonded to the flexible integrated circuit pellet connecting portions of the plurality of conductive metal foils.

BRIEF DESCRIPTION OF THE DRAWINGS

These and other objects and features of the present invention can be understood by reference to the accompanying drawings, in which.

DETAILED DESCRIPTION OF THE PREFERRED EMBODIMENTS

A first embodiment of the present invention will be described with reference to FIGS. 1 to 4.

Figure 1:
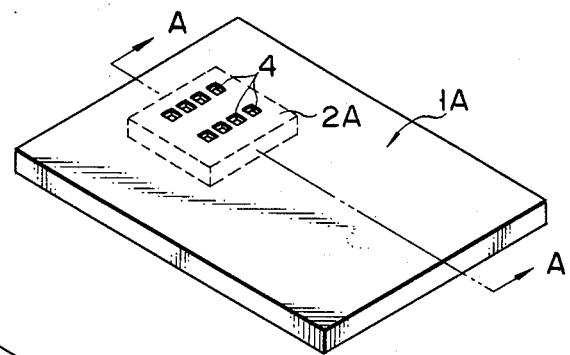
FIG. 1 is an external perspective view of an IC card according to a first embodiment of the present invention.
Figure 2:
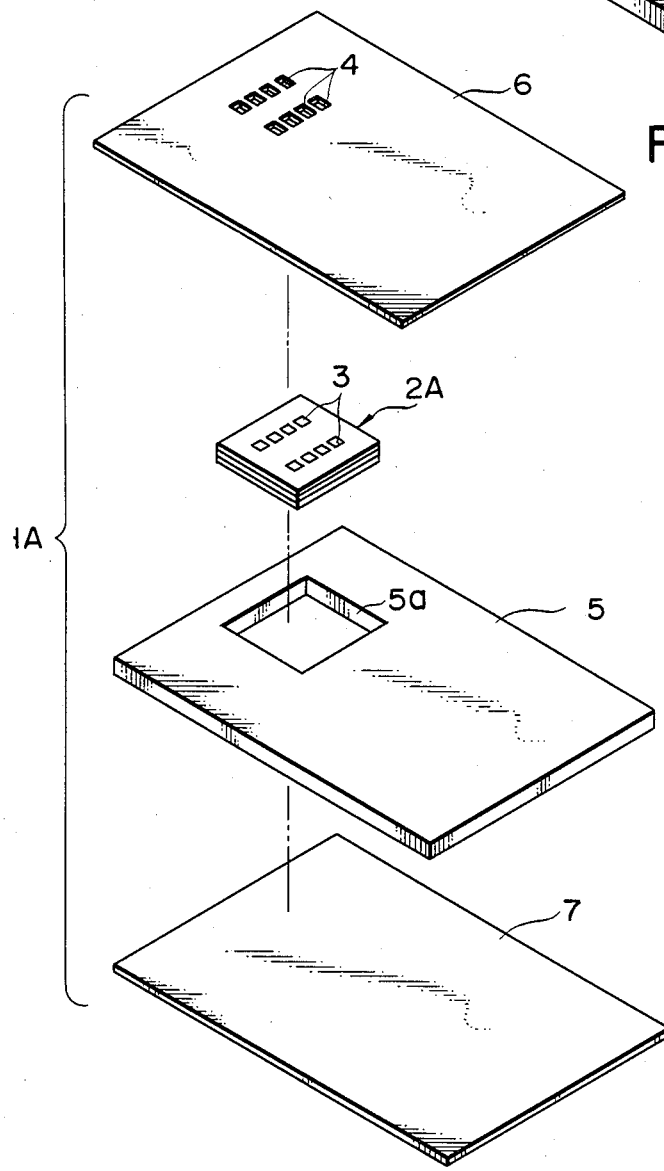
FIG. 2 is an exploded perspective view of the IC card of the first embodiment.

FIG. 1 is an external perspective view of an IC card according to the first embodiment, and FIG. 2 is an exploded perspective view thereof. An IC card 1A is used as a credit card having a total thickness of about 0.8 mm, an identification card or the like, and comprises an IC module 2A mm and including an IC pellet (to be described later), as shown in FIG. 1. Contacts 3 of the module 2A are exposed through-holes 4 formed in the upper surface of the IC card 1A. As shown in FIG. 2, the IC card 1A is formed in the following manner. A fitting hole 5a is formed as an inner core member in a card main body 5 made of a synthetic resin such as vinyl chloride, and the module 2A is directly fitted in the hole 5a. Overcoat films 6 and 7 of polyester, vinyl chloride or the like are adhered to the upper and lower surfaces of the resultant structure. The holes 4 are formed in the upper overcoat film 6 so as to correspond to the contacts 3 of the module 2A.

Figure 3:
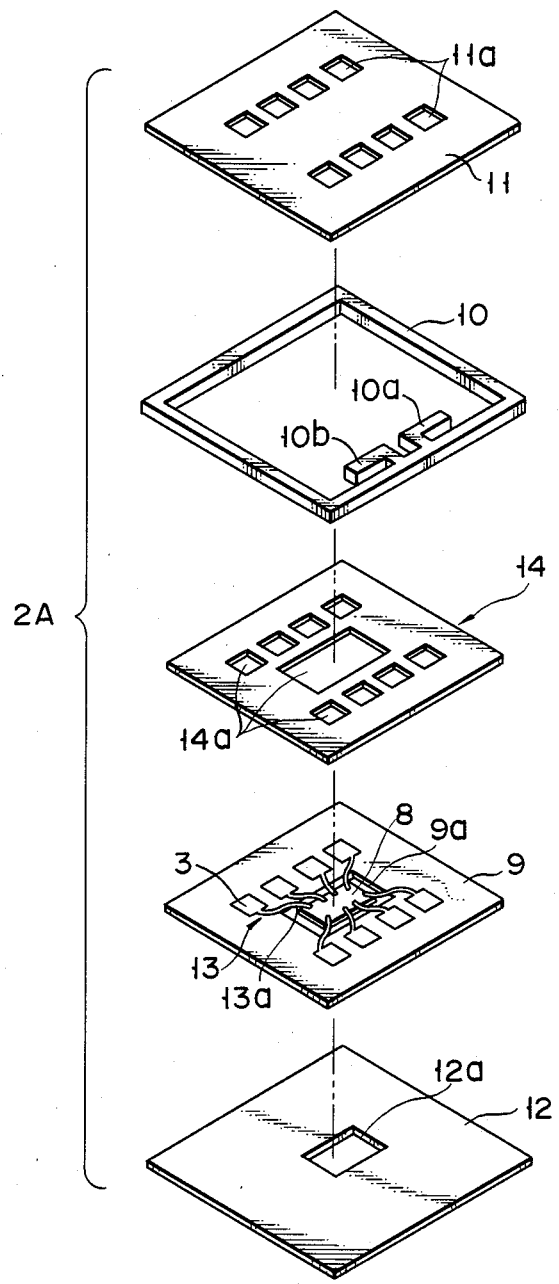
FIG. 3 is an exploded perspective view of an IC module used in the first embodiment.

FIG. 3 is an exploded perspective view of the module 2A. The module 2A has a structure in which a base 9, on which an integrated circuit (IC) pellet 8 and contacts 3 are provided, is arranged in a metal frame 10, the resultant structure being sandwiched between metal plates 11 and 12. The base 9 is a film-like sheet having a hole 9a at its center. The IC pellet 8 possessing a memory portion for storing identification data is arranged in the hole 9a, and the contacts 3 are provided adjacent to two sides of the hole 9a on the upper surface of the base 9. The contacts 3 and lead terminals 13a are formed integrally by etching a metal foil 13 such as a tin plated copper foil coating on the overall upper surface of the base 9. Thus, the lead terminals 13a which extend from the hole 9a are flexible. The lead terminals 13a are connected to corresponding gold (Au) bumps 8a of the IC pellet 8 by bonding to be described later. The base 9 is adhered to the lower surface of the upper metal plate 11 by a double-sided tape 14. In this case, openings 14a are formed in portions of the tape 14 corresponding to the IC pellet 8 and the contacts 3. The metal plates 11 and 12, sandwiching the base 9 arranged in the frame 10 therebetween, are thin stainless steel plates. Openings 11a are formed in portions of the upper metal plate 11 corresponding to the contacts 3, and a recess 12a is formed by half-etching in the upper surface of the lower metal plate 12 so as to correspond to the IC pellet 8. The frame 10 in which the base 9 is arranged is made of stainless steel, and a pair of contacting elements 10a and 10b are formed on one inner side wall of the frame 10. The element 10a contacts the upper metal plate 11, and the other element 10b contacts the lower metal plate 12. Thus, the plates 11 and 12 are rendered conductive and prevent influence of static electricity.

Figure 4:
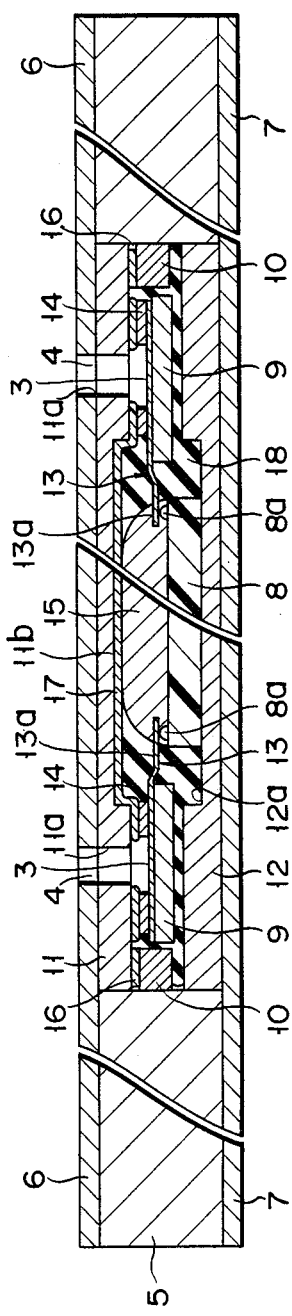
FIG. 4 is a sectional view taken along a line A—A of FIG. 1.

FIG. 4 is a sectional view taken along the line A—A of FIG. 1. A method for assembling the IC card 1A will be described with reference to FIG. 4. In this case, the IC module 2A is assembled first. The metal foil 13, such as copper foil plated by tin, is provided on the upper surface of the base 9, in which is formed the hole 9a, and the foil 13 is etched so as to connect each contact 3 integrally with its corresponding lead terminal 13a, each of these having the flexibility described above. The IC pellet 8 is arranged in the hole 9a of the base 9, and each lead terminal 13a is connected to the corresponding gold (Au) bumps 8a of the IC pellet 8 by bonding. A mold resin 15 is applied on the major surface of the IC pellet 8, including the bonding portion. The IC pellet 8 is fitted in the base 9. The base 9, having the IC pellet 8 and the contacts 3, is arranged in the metal frame 10 and adhered to the lower surface of the upper metal plate 11 by the tape 14. The metal frame 10 is then adhered by an adhesive 16. In this case, a recess 11b is formed in the metal plate 11 by half etching so as for it to correspond to the IC pellet 8, and an insulating coat 17 is formed on the lower surface of the plate 11 corresponding to the recess 11b and the base 9. Therefore, the tape 14 adhered to the base 9 is adhered to the coat 17, and the upper surface of the resin 15 on the major surface of the IC pellet 8 is arranged in the recess 11b of the plate 11 so that the contacts 3 correspond to the openings 11a of the plate 11. A filler 18 is filled inside the frame 10 in a portion below the base 9 and in a gap therebetween, and the metal plate 12 is adhered at the lower side of the assembly. In this case, the lower portion of the IC pellet 8 is arranged in the recess 12a of the plate 12. The base 9, having the IC pellet 8 and the contacts 3, is then sandwiched between the metal plates 11 and 12, thus assembling the module 2A.

Thereafter, the IC module 2A is fitted in the fitting hole 5a formed in the card main body 5, and the overcoat films 6 and 7 are adhered to upper and lower surfaces of the main body 5. In this case, the holes 4 formed in the upper overcoat film 6 correspond to the openings 11a formed in the plate 11. The contacts 3 are exposed through the openings 11a of the plate 11 and the holes 4 of the film 6, thereby realizing the IC card 1A shown in FIG. 1.

The IC card 1A has a structure in which the base 9 comprising the IC pellet 8 and the contacts 3 is arranged in the frame 10 and sandwiched between the stainless steel metal plates 11 and 12 so as to constitute the IC module 2A, the IC module 2A being fitted in the fitting hole 5a formed in the synthetic resin card main body 5. Thus, the IC card of this embodiment has a high mechanical strength with respect to external forces such as a bending force, a depression force or the like and, as such, exhibits excellent durability. Since the pair of contacting elements 10a and 10b which contact the plates 11 and 12, respectively, are provided for the metal frame 10, the upper and lower plates 11 and 12 are connected to each other, thereby preventing influence of static electricity. Therefore, the IC pellet 8 can be satisfactorily protected.

According to the above-mentioned mounting structure of the IC pellet 8, the metal foil 13 provided on the base 9 is etched so as to form the contacts 3 integrally with the lead terminals 13a, and the lead termials 13a are connected to the IC pellet 8 by bonding, thus achieving a high yield of a simple structure through a small number of manufacturing steps.

Figure 5:
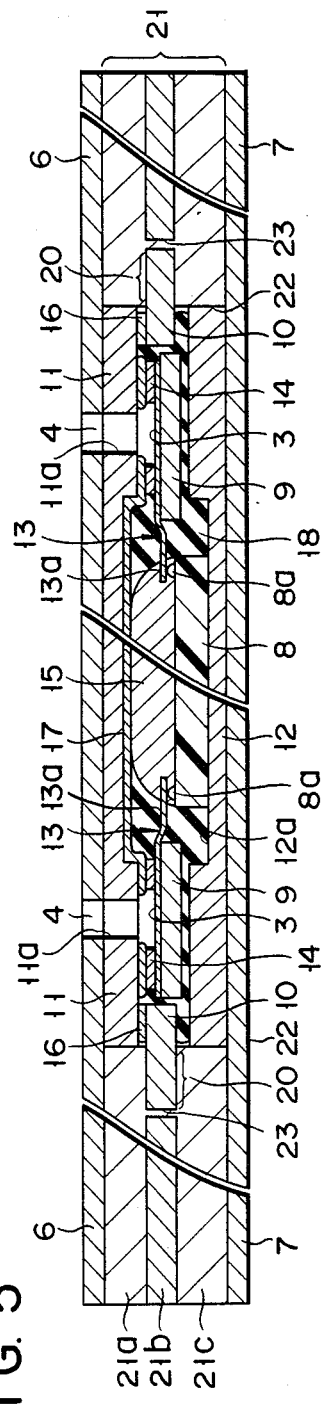
FIG. 5 is a sectional view of a modification of the first embodiment.

Note that in the first embodiment, the module 2A is simply fitted in the fitting hole 5a of the main body 5. However, the present invention is not limited to this. For example, as shown in the modification of FIG. 5, collar portions 20 are formed on the side walls of the module 2A and can be inserted into the grooves 23 of the fitting hole 22 formed in the card main body 21. The collar portions 20 can be formed on the side walls of the IC module 2A by externally extending the metal frame 10 beyond the upper and lower metal plates 11 and 12. Again, the grooves 23 for receiving the collar portions 20 are formed in the inner walls of the fitting hole 22 of the main body 21. In this case, the card main body 21 is constituted by laminated panels 21a, 21b and 21c made of a synthetic resin such as vinyl chloride. The upper and lower panels 21a and 21c define the fitting hole 22 for receiving the module 2A, and the intermediate panel 21b defines the grooves 23 for receiving the collar portions 20. In the IC card 1A with the above arrangement, the collar portions 20 of the IC module 2A are inserted into the grooves 23 formed in the fitting hole 22, thus providing still greater mechanical strength as compared to that of the first embodiment.

As described above, according to this embcdiment, the IC card has a structure in which the IC pellet is directly connected to the flexible lead terminals which are formed on the base. Consequently, if the IC card is subjected to a shock or a bending force, these forces will not, because of their absorption by the flexible lead terminals, adversely affect operations between the IC pellet and the base. Thus the IC card provides very high reliability with respect to its capacity to withstand damage. Moreover, since a bonding step for electrically connecting the pellet need only be performed once, the number of manufacturing steps can be decreased and the IC card easily manufactured, resulting in low cost.

Note that the mechanical strength and economical benefit of the first embodiment can also be provided in second and third embodiments, to be described later, and will not be discussed repeatedly.

Figure 7:
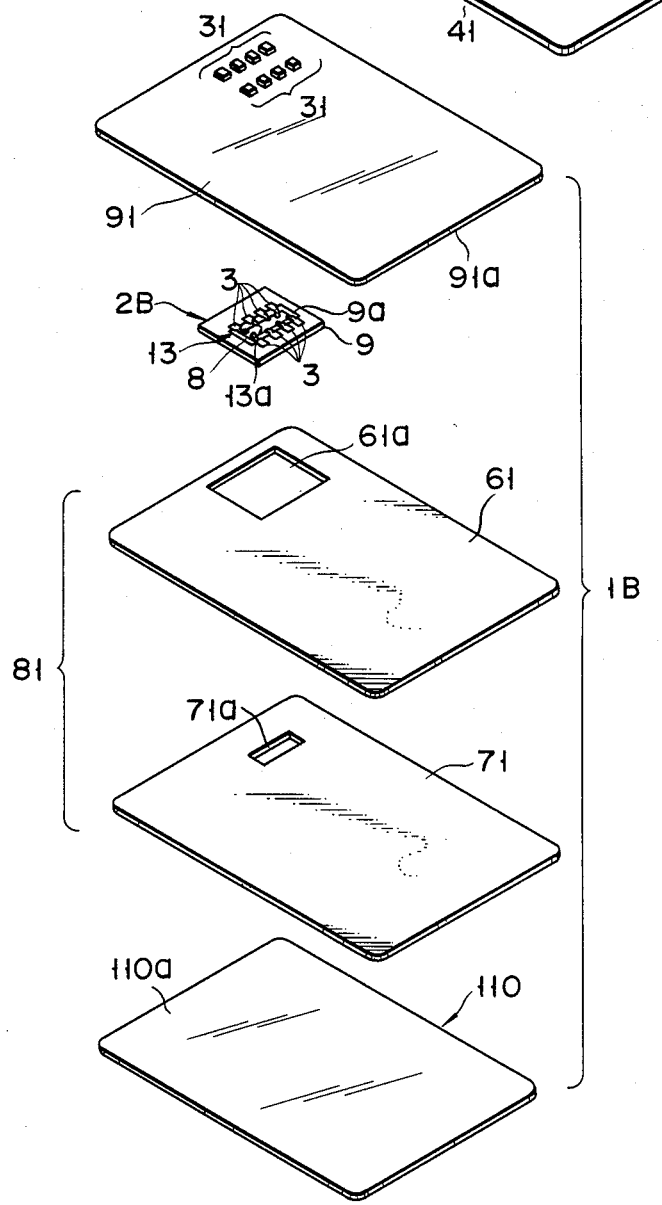
FIG. 7 is an exploded perspective view of the IC card of the second embodiment.
Figure 8:
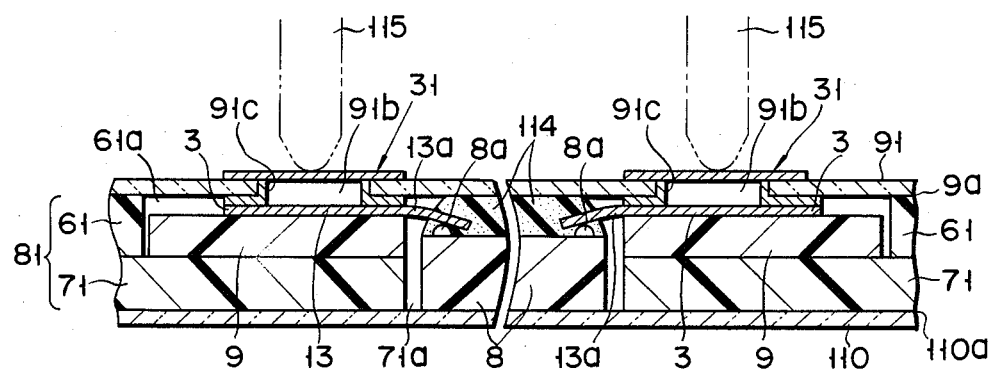
FIG. 8 is an enlarged sectional view of the main part of the second embodiment.

A second embodiment of the present invention will be described hereinafter with reference to FIGS. 6 to 8.

Figure 6:
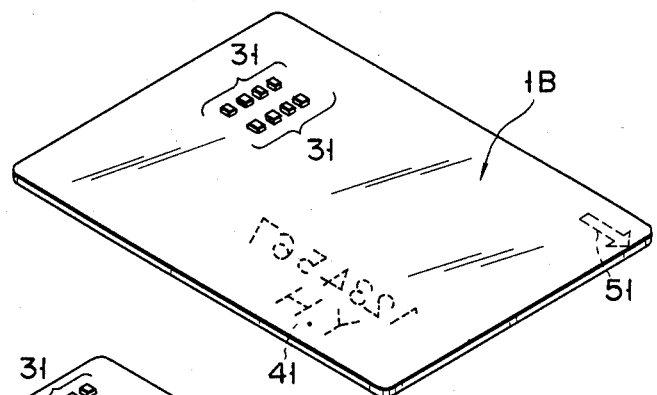
FIG. 6 is an external perspective view of an IC card according to a second embodiment of the present invention viewed from its rear surface.

FIG. 6 is an overall perspective view of an IC card 1B. The IC card 1B is used as a credit card having a total thickness of about 0.8 mm, an identification card or the like, and comprises an IC module 2B mm and including an IC pellet (to be described later). External terminals 31 are arrayed so as to be extended therefrom on the rear surface (upper surface in FIG. 6) of the card 1B, and an embossed portion 41 indicating identification data such as a holder code and an arrow mark 51 indicating the insertion direction of the card are formed on the front surface (lower surface in FIG. 6) of the card 1B.

The IC card 1B has a structure in which the IC module 2B is arranged in an inner core 81 having upper and lower inner cores 61 and 71 overlapped with each other, the upper and lower surfaces of the inner core 81 being covered with overcoats 91 and 110. The upper inner core 61 comprises a hard vinyl chloride layer having a thickness of about 300 $\mu$m, and a rectangular hole 61a for storing the IC module 2B is formed in the left corner of the core 61. The lower inner core 71 comprises a hard vinyl chloride layer having a thickness of about 300 $\mu$m, and a hole 71a for storing a portion (an IC pellet 8 to be described later) extending from the lower surface of the module 2B is formed in the core 71. The IC module 2B comprises a base 9 made of polyimide or glass epoxy; the IC pellet 8, arranged in a hole 9a formed at the center of the base 9 and possessed of identification data; lead terminals 13a, both connected to corresponding gold (Au) bumps 8a (see FIG. 8) of the IC pellet 8, and holding the IC pellet 8; and contacts 3. The terminals 13a and the contacts 3 are integrally formed by etching a metal foil 13 such as a copper foil, and by plating tin (Sn) on the upper and lower surfaces of the terminals 13a and the contacts 3. A distal end of each terminal 13a is connected to the corresponding gold (Au) bumps 8a of the IC pellet 8, and is sealed with a mold resin 114, as will be described later. The base 9 has a rectangular shape so as to be directly fitted in the hole 61a of the core 61.

The overcoat 91 covering the upper surface of the core 61 comprises a transparent soft vinyl chloride layer having a thickness of about 100 $\mu$m, whereon external terminals 31 are provided on portions corresponding to the contacts 3 of the module 2B. The external terminals 31 are arranged in a 2×4 matrix, each terminal having a size of 2 mm×1.7 mm. The terminals 31 are exposed from the upper surface of the overcoat 91 and gold (Au) is plated on the exposed portions. The terminals 31 are also exposed to the lower surface of the overcoat 91, on which, it should be noted, a print layer 91a is provided. The lower overcoat 110 covering the lower surface of the lower inner core also comprises a transparent soft vinyl chloride layer having a thickness of about 100 $\mu$m, a print layer 110a being provided thereon.

The inner core 81 is constituted by laminating the upper and lower inner cores 61 and 71 so as to overlap each other, the hole 71a of the core 71 corresponding to substantially a central portion of the hole 61a of the core 61. The base 9 of the module 2B is arranged in the hole 61a of the core 61 and the IC pellet 8, extending downward from the base 9, is arranged in the hole 71a of the core 71, thus storing the module 2B in the core 81.

Assembly of the IC card 2B with the above arrangement and according to the second embodiment will be described hereinafter.

The print layer 91a is provided on the lower surface of the overcoat 91, and through-holes 91b are formed in portions of the overcoat 91 on which the terminals 31 are to be formed. A copper foil is laminated and etched on the upper surface of the overcoat 91 so as to cover the through-holes 91b and, thereby, form the terminals 31. Copper is plated on the inner surface of each through-hole 91b and the surrounding portions thereof so as to form an inner conductive portion 91c. Gold, preferably, is plated on the external terminals 31 and the inner conductive portions 91c to improve anti-wear and anti-oxidation properties.

The IC module 2B is formed in advance as follows. The hole 9a for receiving the IC pellet 8 is formed in the base 9, and a metal foil 13, such as a copper foil, is laminated on the overall surface of the base 9, including the hole 9a. Then, the foil 13 is etched so as to form the contacts 3 corresponding to the terminals 31 provided on the overcoat 91 and the lead terminals 13a extending in the hole 9a. Then, tin is plated on the contacts 3 and the terminals 13a, and the gold (Au) bumps 8a of the IC pellet 8 are bonded. In this case, the gold (Au) bumps 8a correspond to the lead terminals 13a and are melted by a pulse heating method or the like. The major surface of the IC pellet 8, including the gold (Au) bumps 8a, is sealed with resin 114.

The IC module 2B is fitted in the hole 61a of the inner core 81 having the upper and lower inner cores 61 and 71. In this case, the base 9 of the module 28 is held by the upper surface of the core 71, and the IC pellet 8 is tightly fitted in the hole 71a. Since the base 9 is tightly fitted in the hole 61a, the module 2B cannot move in a horizontal direction, even without using any adhesive, and the contacts 3 can be aligned at predetermined positions. Of course, for the purpose of assembly, the module 28 can be temporarily adhered to the core 81.

Thereafter, the overcoats 91 and 110 are laminated on the inner core 81 using a well known dry laminate method, or a hot laminate method. In this case, the terminals 31 of the overcoat 91 are arranged so as to correspond to the contacts 3 of the module 2B. For this reason, when probes 115, indicated by alternate long and two dashed lines, are urged against the terminals 31, the inner conductive portions 91c are brought into contact with the corresponding contacts 3 and the terminals 31 are connected to the contacts 3. Note that the embossed portion 41 is formed in the lower overcoat 110 by another press step after laminating the overcoats 91 and 110.

According to the IC card 1B of the second embodiment, the IC module 2B arranged in the inner core 81 is covered with the overcoats 91 and 110, the external terminals 31 which are externally exposed through the upper and lower surfaces of the overcoat 91, and the lead electrodes 13a connected to the gold (Au) bumps 8a of the IC pellet 8 are provided so as to correspond to the external terminals 31. Thus, if the IC card 1B is bent, the IC module 2B cannot be dislodged and will hold firmly. Furthermore, since the external terminals 31 extend from the upper surface of the overcoat 91 and are not buried therein, dust and the like do not readily attach thereto and, should this happen, it can be easily removed, thus achieving highly reliable conductivity.

Note that in the second embodiment, an inner portion of each external terminal 31 contacts the contacts 3 of the IC module 2B. However, the terminals 31 need not always contact the contacts 3. When they are separated from each other, the contacts 3 can be arranged to contact each other when the probes 115 contact the corresponding terminals 31.

Figure 9:
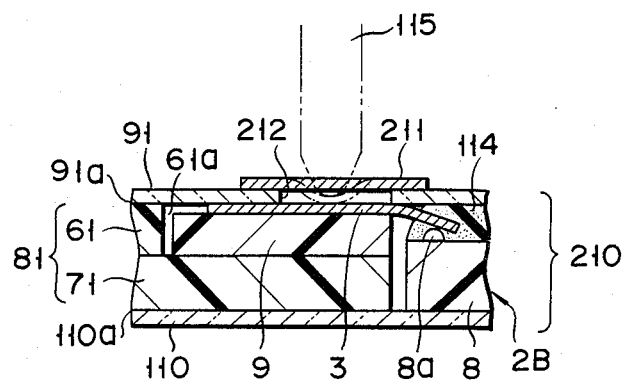
FIG. 9 is an enlarged sectional view of the main part of an IC card according to a third embodiment of the present invention.

A third embodiment of the present invention will be described with reference to FIG. 9. In this case, the same reference numerals in the third embodiment denote the same parts as in the second embodiment, and a detailed description thereof will be omitted.

In an IC card 210, external terminals 211 are separated from contacts 3 but can be brought into contact therewith. A vertical through-hole 212, which corresponds with the contact 3 provided on an IC module 2B, is formed in a portion of an upper overcoat 91 provided on an upper surface of an inner core 81 and the external terminal 211 is formed on the upper surface of the overcoat 91 so as to cover the hole 212. In the same manner as in the first embodiment, the external terminals 211 are made of a copper foil, have a size of 2 mm × 1.7 mm, and are formed only on the upper surface of the overcoat 91. Therefore, the external terminals 211 oppose the contacts 3 with which they are to be brought into contact with through the hole 212 of the overcoat 91.

When the external terminals 211 are depressed by probes 115, the terminals 211 are bent and contact the contacts 3 through the hole 212. Thus, the probes 115 are electrically connected to the corresponding gold (Au) bumps 8a of the IC pellet 8 through the external terminals 211 and the contacts 3. In this case, since the overcoat 91 has a thickness of about 100 $\mu$m, the terminals 211 are easily bent to contact their corresponding contacts 3 through the hole 212.

In the IC card 210 of the third embodiment, since the terminals 211 are separated from the contacts 3, static electricity, in addition to the same effect as in the second embodiments, can be prevented.

Figure 10:
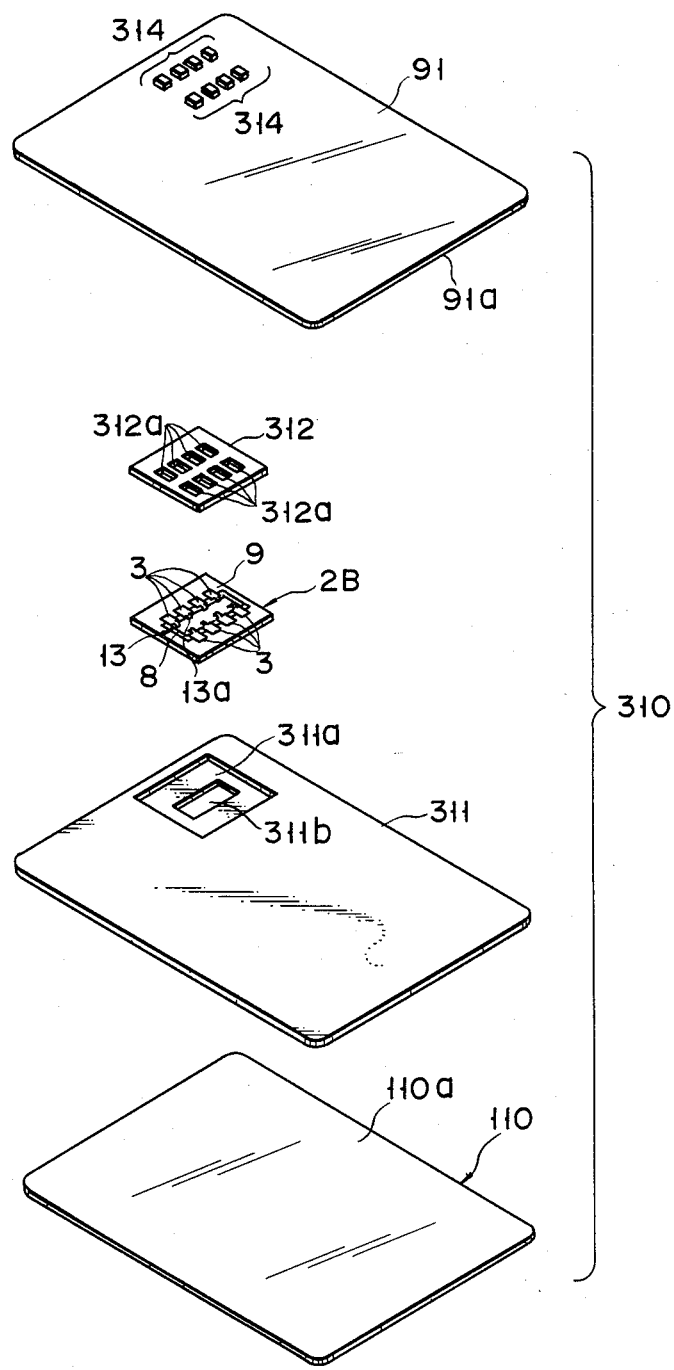
FIG. 10 is an exploded perspective view of an IC card according to a fourth embodiment of the present invention.
Figure 11:
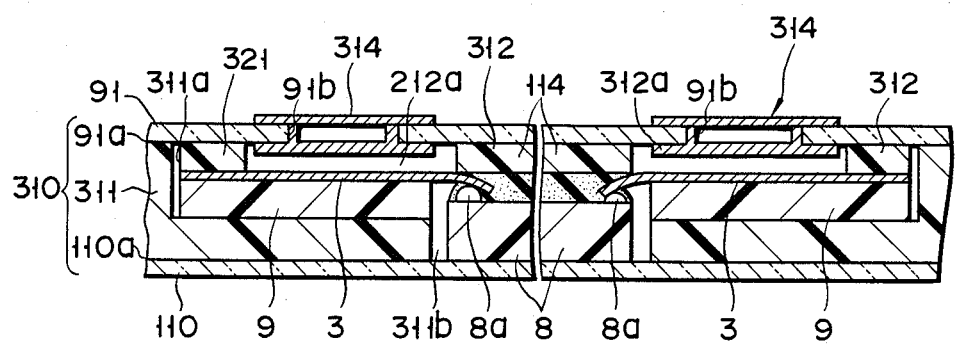
FIG. 11 is an enlarged sectional view of the main part of the fourth embodiment.
Figure 12:
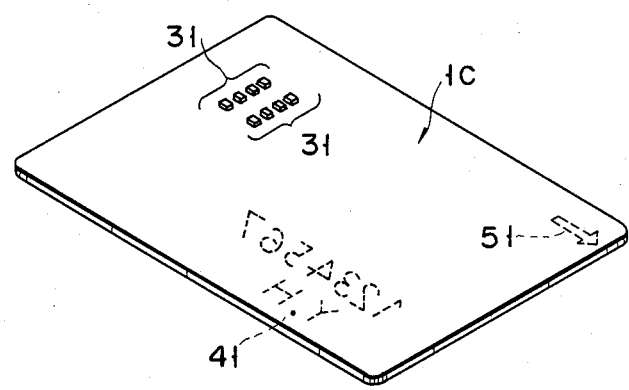
FIG. 12 is an external perspective view of an IC card according to a fifth embodiment of the present invention viewed from its rear side.

A fourth embodiment of the present invention will be described with reference to FIGS. 10 and 11. In this case, the same reference numerals in the fourth embodiment denote the same parts as in the second embodiment, and a detailed description thereof will be omitted.

In an IC card 310, an IC module 2B is arranged in an inner core 311, a spacer 312 is arranged on the upper surface of the module 2B and, thereafter, the upper and lower surfaces of the inner core 311 are covered with overcoats 91 and 110. The inner core 311 comprises a hard vinyl chloride layer having a thickness of about 600 $\mu$m, and a storing recess 311a is formed in the left corner thereof. The recess 311a stores the IC module 2B and the spacer 312, and a hole 311b for storing an IC pellet 8, extending downward from the module 2B, is formed in the bottom of the core 311. The spacer 312 is a thin sheet provided on the module 2B, with openings 312a formed therein so as to correspond to contacts 3 of the module 2B. The overcoats 91 and 110 are provided on the upper and lower surfaces of the inner core 311 and cover the module 2B and the spacer 312, and print layers 91a and 110a are provided on the respective contacting surfaces thereof. In this case, external terminals 314 are provided on the overcoat 91 so as to correspond to openings 312a of the spacer 312, i.e., the contacts 3 of the module 2B.

The module 2B is arranged in the recess 311a of the core 311, and a base 9 is held on the bottom of the recess 311a. The IC pellet 8 extending downward from the module 2B is arranged in the hole 311b of the recess 311a. The spacer 312 is adhered to the module 2B, and is arranged on the recess 311a. The overcoats 91 and 110 are laminated on the upper and lower surfaces of the inner core 81 so as to cover the module 2B and the spacer 312. In this case, the terminals 314 provided on the overcoat 91 are formed such that copper foils are provided on the upper and lower surfaces of the overcoat 91 and are connected through through-holes 91b. The copper foil at the lower side opposes the corresponding contact 3 of the module 2B through the opening 312a of the spacer 312 and can be brought into contact therewith.

When the external terminals 314 are depressed by probes 115, the terminals 314 are bent to contact the corresponding contacts 3 through the opening 312a of the spacer 312, thereby electrically connecting the probes 115 to the corresponding gold (Au) bumps 8a of the IC pellet 8 through the terminals 314 and the contacts 3.

In the IC card of the fourth embodiment, the terminals 314 are separated from the contacts 3 and the same effect as in the third embodiment can be obtained.

As described above, according to the IC card of the second to fourth embodiments of the present invention, the contacts connected to the corresponding gold (Au) bumps of the IC pellet are provided in the inner core and can be connected to the external terminals provided on the overcoat. When the IC card is bent, the IC module, including the IC pellet, cannot be dislodged and, in holding fast, realizes highly reliable conductivity.

A fifth embodiment of the present invention will be described with reference to FIGS. 12 to 15.

Figure 13:
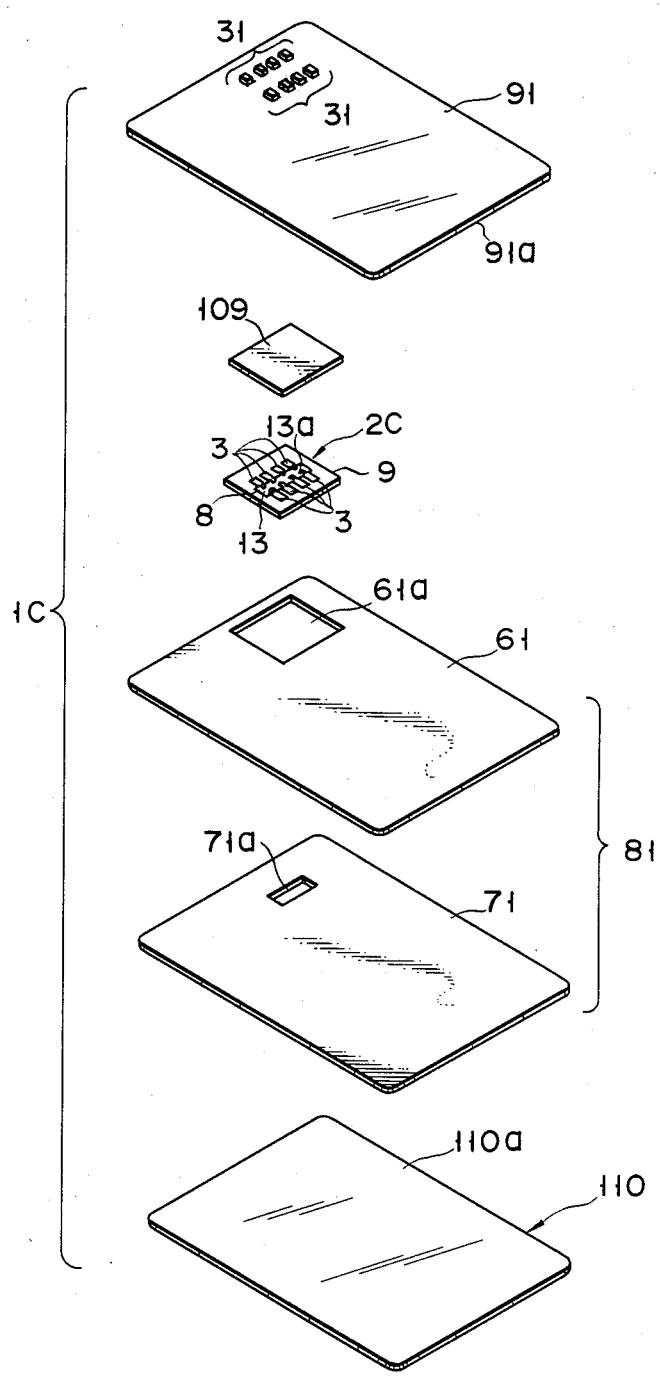
FIG. 13 is an exploded perspective view of the IC card of the fifth embodiment.

An IC card IC of this embodiment comprises an IC module 2C as shown in FIG. 13. External terminals 31 are arrayed extending therefrom on the back surface of the card IC (an upper surface in FIG. 12), and an embossed portion 41 representing identification data such as a holder code, and an arrow mark 51 indicating the insertion direction of the card are provided on the front surface thereof (a lower surface in FIG. 12).

Figure 14:
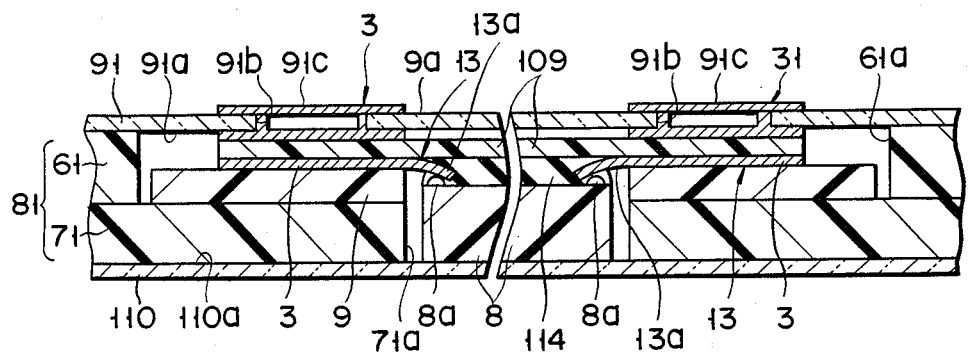
FIG. 14 is an enlarged sectional view of the main part of the fifth embodiment.

In the IC card IC, the IC module 2C is arranged in an inner core 81 constituted by overlapping upper and lower inner cores 61 and 71, as shown in FIGS. 13 and 14. An anisotropically electric sheet 109 is provided on the IC module 2C, and the upper and lower surfaces of the inner core 81 are covered with overcoats 91 and 110. The upper inner core 61 comprises a hard vinyl chloride layer of a 300 $\mu$m thickness, and is provided with a rectangular hole 61a in the left corner thereof for storing the module 2C and the sheet 109. The lower inner core 71 comprises a hard vinyl chloride layer of a 300 $\mu$m thickness, and is provided with a hole 71a for storing a portion extending downward from the IC module 2C (i.e., an IC pellet 8 to be described later). Therefore, tne inner core 81 is constituted by laminating the upper and lower inner cores 61 and 71, and a central portion of the hole 61a of the core 61 corresponds with the hole 71a of the core 71.

The IC module 2C is stored in the holes 61a and 71a of the core 81 and comprises a base 9, the IC pellet 8, a metal foil 13, a mold resin 114 and the like. The base 9 is made of polyimide or glass epoxy and has a rectangular shape suited for being tightly fitted in the hole 61a of the core 61. A hole 9a is formed at the center of the base 9, and the IC pellet 8 possessing identification data is arranged in the hole 9a of the base 9. Gold (Au) bumps 8a are provided on the upper surface of the IC pellet 8. The metal foil 13 is formed so that a copper foil laminated on the base 9 is etched and tin-plated. The foil 13 comprises contacts 3 fixed on the base 9 and lead terminals 13a extending in the hole 9a of the base 9. The terminals 13a are bonded on the gold (Au) bumps 8a of the IC pellet 8 to hold the IC pellet 8. The mold resin 114 is provided on the IC pellet 8 and covers the distal ends of the gold (Au) bumps 8a and the terminals 13a.

Figure 15:
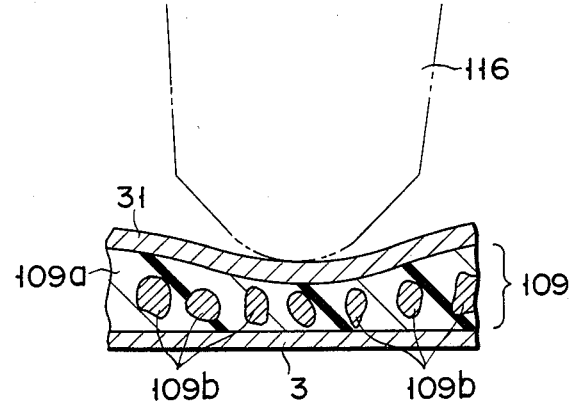
FIG. 15 is a sectional view showing an operation state of an anisotropically conductive sheet used in the fifth embodiment.

The anisotropically electric sheet 109 is a sheet formed by mixing fine conductive particles 109b such as nickel (Ni), aluminum (Al), solder, graphite powder or the like in a silicone polymer 109a, as shown in FIG. 15, and arranged in the upper surface of the module 2C. The sheet 109 normally has an insulating property (i.e., a very high resistance), and only when depressed does it exhibit conductivity; only, however, in a depression direction. Therefore, as shown in FIG. 15, when the external terminals 31 of the overcoat 91 are depressed by the probes 116 of a card reader, the sheet 109 exhibits conductivity along the depression direction, thereby electrically connecting the terminals 31 and the corresponding contacts 3 of the metal foil 13 provided on the module 2C.

The upper overcoat 91 covering the upper surface of the core 61 comprises a soft transparent vinyl chloride film of a 100 μm thickness. The terminals 31 are provided on portions of the overcoat 91 corresponding to the contacts 3 of the module 2C. The terminals 31 are made of a copper foil or the like, and arrayed in a 2×4 matrix. Each terminal 31 has a size of 2 mm×1.7 mm and extends from the upper surface of the overcoat 91. The terminals 31 are also exposed to the lower surface through the corresponding through-holes 91b formed in the overcoat 91. The lower overcoat 110 covering the lower surface of the core 71 comprises the same soft transparent vinyl chloride layer of a 100 μm thickness as that of the core 61, a print layer 110a being provided on the upper surface thereof.

Assembly of the IC card IC of the fifth embodiment will be described hereinafter.

The print layer 91a is provided on the lower surface of the upper overcoat 91, and the through-holes 91b are formed in portions of the overcoat 91 in which the terminals 31 are to be formed. A copper foil is laminated and etched on the upper surface of the overcoat 91 so as to cover the through-holes 91b and, thereby, to form the terminals 31. Copper is plated on the inner surfaces of the holes 91b and the surrounding portions thereof from the lower surface of the overcoat 91 so as to form inner conductive portions 91c. The terminals 31 and the inner conductive portions 91c are, preferably, gold-plated so as to improve anti-wear and anti-oxidation properties.

The IC module 2C is formed in advance in the following manner. The hole 9a for receiving the IC pellet 8 is formed in the base 9, and the metal foil 13, such as a copper foil, is laminated on the upper surface of the base 9, including the hole 9a. The metal foil 13 is etched to form the contacts 3 corresponding with the terminals 31 provided on the overcoat 91 and the lead terminals 13a extending in the hole 9a. The contacts 3 and the terminals 13a are tin-plated and, thereafter, the gold (Au) bumps 8a of the IC pellet 8 are bonded. In this case, the gold (Au) bumps 8a of the IC pellet 8 correspond with the terminals 13a and are bonded by a pulse heating method or the like. The major surface of the IC pellet 8, including the gold (Au) bumps 8a, is then sealed with resin 114.

The IC module 2C is fitted in the hole 61a of the inner core 81 constituted by laminating the upper and lower cores 61 and 71. In this case, the base 9 of the module 2C is held by the upper surface of the core 71 and the IC pellet 8 is tightly fitted in the hole 71a. As described above, since the base 9 is tightly fitted in the hole 61a, the module 2C cannot move in a horizontal direction, even without using any adhesive, the contacts 3 being, therefore, aligned in predetermined positions. Of course, for the sake of assembly, the module 2C can be temporarily adhered to the inner core 81.

Thereafter, the anisotropically electric conduction sheet 109 is arranged on the module 2C. The overcoats 91 and 110 are laminated on the inner core 81 using a well known dry laminate method, or hot laminate method. In this case, the external terminals 31 of the overcoat 91 are arranged to correspond with the contacts 3 of the module 2C through the sheet 109, as shown in FIGS. 14 and 15. For this reason, although the terminals 31 and the contacts 3 contact the sheet 109, since the sheet 109 normally has an insulating property, i.e., a high resistance, the terminals 31 and the contacts 3 cannot be electrically connected. However, the terminal 31 and the corresponding contact 3 can be connected when the terminal 31 is depressed by the probe 116 of the card reader, as shown in FIG. 15, since, in this instance, the terminal 31 is bent to depress the sheet 109. Thus, the identification data in the IC pellet 8 are supplied to the card reader through the lead terminals 13a, the probes 116 and the like. The IC pellet 8 can be satisfactorily protected without being influenced by external static electricity.

Figure 16:
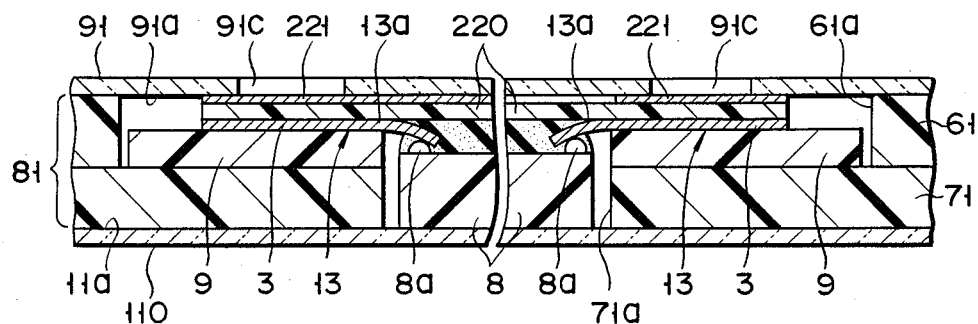
FIG. 16 is a sectional view showing the main part of a sixth embodiment.

A sixth embodiment of the present invention will be described with reference to FIG. 16. In this case, the same reference numerals in the sixth embodiment denote the same parts as in the fifth embodiment, and a detailed description thereof will be omitted.

In the sixth embodiment, an anisotropically electric adhesive layer 220 is provided on an IC module 2C, and external terminals 221 are provided on it. The layer 220 is formed in such a manner that conductive particles having a particle size of about 10 to 20 μm are dispersed and mixed in an insulating adhesive, the resultant mixture being screen printed on the upper surfaces of the module 2C and the base 9 to a thickness of about 30 μm, and dried and solidified at 70° C. to 130° C. The external terminals 221 are printed on the upper surface of the layer 220 so as to correspond to contacts 3 of the module 2C after the layer 220 is solidified. In this case, rectangular holes 91c are formed in an upper overcoat 91 so as to correspond to the external terminals 221. The terminals 221 are exposed through the holes 91c, through which a probe 116 of a card reader contacts them. For this reason, the layer 220 is rendered conductive only when the external terminals 221 are depressed to connect the terminals 221 electrically to the corresponding contacts 3. However, the layer 220 normally has an insulating property, i.e., a high resistance, and protects the IC pellet 8 from the influence of external static electricity.

In the sixth embodiment, the anisotropically electric adhesive layer 220 is provided on the IC module 2C. However, the external terminals 221 can be printed on the lower surface of the overcoat 91, and the layer 220 can then be printed thereon.

Figure 17:
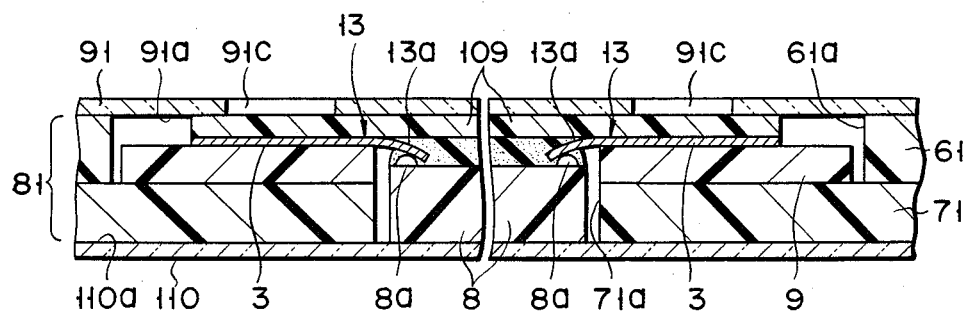
FIG. 17 is a sectional view showing the main part of a seventh embodiment.

A seventh embodiment of the present invention will be described with reference to FIG. 17. In this case, the same refernce numerals in the seventh embodiment denote the same parts as in the fifth embodiment, and a detailed description thereof will be omitted.

In the seventh embodiment, probes 116 of a card reader are brought into direct contact with a anisotropically electric sheet 109. The sheet 109 is arranged on the upper surface of an IC module 2C, and holes 91c are formed in the upper overcoat 91 so as to correspond with contacts 3 of the module 2C. Thus, the sheet 109 is exposed through the holes 91c. Therefore, only when the probes 116 contact the sheet 109 does the corresponding portion of the sheet 109 exhibit conductivity and are the probes 116 and the opposing contacts 3 connected to each other. Otherwise, the sheet 109 exhibits an insulating property, thus protecting the IC pellet 8.

Note that in the seventh embodiment, the holes 91c are formed in the overcoat 91 so as to correspond to the contacts 3. However, the present invention is not limited to this. Alternatively, a single large opening corresponding to the sheet 109 can be formed.

In this case, the arrangement need not be limited to the above fifth to seventh embodiments. For example, a gap can be formed between the contacts 3 and the anisotropically electric member 109 or 220, or between the member 109 or 220 and the external terminals 31 or 221.

As described above, according to an IC card of the fifth to seventh embodiments, external static electricity generated by cloth or a human body can be prevented from flowing into an IC pellet by the anisotropically electric layer provided on a connecting terminal connected to the electrode terminal of the IC pellet. For this reason, the IC pellet can be satisfactorily protected from the influence of static electricity.

What is claimed is:

1. An IC card comprising:
    an IC module having an insulating base sheet in which an opening for containing an IC pellet is formed; a plurality of conductive metal foils each having one end which is placed at the inner side of the opening in said base sheet, and another end at which a contact pad is formed; an IC pellet having a plurality of electrodes arranged in the opening of said base sheet each having a connecting portion respectively connected to the one end of said metal foils; and a resin layer which coats said connecting portion of each electrode of said IC pellet to the corresponding one end of said metal foil;
    laminate structure means having a first core sheet in which a first hole for containing the base sheet of said IC module is formed; a second core sheet having the same surface size as the first core sheet, in which a second hole for containing said IC pellet is formed; an upper sheet having the same surface size as said first and second core sheets including through-holes formed therein respectively located opposite the contact pads of said metal foil; and a lower sheet having the same surface size as said first and second core sheets and covering the second hole of said second core sheet; and
    external terminals provided respectively in each through hole of said upper sheet and electrically connected to said contact pad.

2. An IC card according to claim 1, wherein each of said external terminals is attached to said upper sheet and electrically connected to said contact pad.

3. An IC card according to claim 2, wherein each of said external terminals has a first portion which covers the periphery of each through hole and a second portion covering the inside of each through hole at an upper surface side of said upper sheet.

4. An IC card according to claim 3, wherein said external terminals means has a portion which covers a lower surface side of said upper sheet, and electrically connects the upper surface side of the upper sheet to the lower surface side of said upper sheet.

5. An IC card comprising:
    an IC module including an IC pellet having a plurality of electrodes each having a connecting portion; a plurality of conductive leads respectively having one end which is connected to the connecting portion of the plurality of electrodes of said IC pellet, and another end on which a contact pad is formed; and a resin layer covering a connecting portion of each electrode of said IC pellet and the corresponding one end of said conductive leads;
    laminate structure means having a first core sheet in which a first hole for containing the base sheet of said IC module is formed; a second core sheet having the same surface size as the first core sheet, in which a second hole for containing said IC pellet is formed; an upper sheet having the same surface size as the said first and second core sheets including through-holes formed therein respectively located opposite the contact pads of said plurality of conductive leads; and a lower sheet having the same surface size as said first and second core sheets and covering the second hole of said second core sheet; and
    a plurality of external terminal means attached to said upper sheet to cover each through-hole of said upper sheet and being spaced from and above said plurality of contact pads, respectively, which is for deforming downward under applied pressure of a probe to contact its corresponding contact pad.

6. An IC card according to claim 5, wherein each of said plurality of external terminal means is formed of metal foil and is adhered to an upper surface of said upper sheet.

7. An IC card according to claim 6, wherein said external terminal means has a lower end surface extending to a rear surface of said upper sheet, and said laminated structure means has spacing means for spacing a lower end surface of said external terminal means from said plurality of contact pads.

8. An IC card according to claim 7, wherein said spacing means is a space sheet.

9. An IC card comprising:
    an IC module including an IC pellet having a plurality of electrodes each having a connecting portion; a plurality of conductive leads respectively having one end which is connected to the connecting portion of the plurality of electrodes of said IC pellet, and another end on which a contact pad is formed; and a resin layer covering the connecting portion of each electrode of said IC pellet and the corresponding one end of said conductive leads;
    laminate structure means having a first core sheet in which a first hole for containing the base sheet of said IC module is formed; a second core sheet having the same surface size as the first core sheet, in which a second hole for containing said IC pellet is formed; an upper sheet having the same surface size as the said first and second core sheets including through-holes formed therein respectively located opposite the contact pads of said plurality of conductive leads; and a lower sheet having the same surface size as said first and second core sheets and covering the second hole of said second core sheet;

a plurality of external terminals arranged at each through-hole of said upper sheet; and an anisotropically electric conductive layer provided, respectively, between the contact pads on the plurality of conductive leads of said IC module and said plurality of external terminals.

10. An IC card according to claim 9, wherein said anisotropically electric conductive layer is adhered to the plurality of conductive leads and base sheet.

11. An IC card comprising:

an IC module including an IC pellet having a plurality of electrodes each having a connecting portion; a plurality of conductive leads respectively having one end which is connected to the connecting portion of the plurality of electrodes of said IC pellet, and another end on which a contact pad is formed; and a resin layer covering the connecting portion of each electrode of said IC pellet and the corresponding one end of said conductive leads;

an inner core member having a shallow cavity for containing a base sheet of said IC module and a deep cavity for containing said IC pellet;

a transparent uppermost sheet positioned on one surface of said inner core member and having a plurality of through-holes formed therein respectively located opposite the contact pads of said conductive leads, and a printing layer provided on its inner surface opposite to said inner core member;

laminate structure means, with a surface size the same as said inner core member and said uppermost sheet, arranged on another surface of said inner core member, and including a transparent lowermost sheet arranged with its inner surface opposite to said inner core member; and a plurality of external terminals respectively arranged in each through-hole of said uppermost sheet and having an upper surface adapted to be in contact with an external probe, and a lower surface connected to said contact pad.

* * * * *